(12) United States Patent
Brcka

(10) Patent No.: US 6,523,493 B1
(45) Date of Patent: *Feb. 25, 2003

(54) RING-SHAPED HIGH-DENSITY PLASMA SOURCE AND METHOD

(75) Inventor: Jozef Brcka, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/629,515

(22) Filed: Aug. 1, 2000

(51) Int. Cl.[7] ............................................. C23C 16/507
(52) U.S. Cl. ................. 118/723 I; 118/723 R; 156/345.48; 156/345.49
(58) Field of Search ................. 118/715, 719, 118/723 AN, 723 E, 723 I, 723 IR, 723 MA, 723 MP, 723 R, 725, 726, 728; 156/345; 204/192.12, 192.15, 192.3, 192.32, 192.33, 192.37, 298.06, 298.08, 292.11, 298.34; 216/68, 70

(56) References Cited

U.S. PATENT DOCUMENTS

| | | | | |
|---|---|---|---|---|
| 5,277,751 A | * | 1/1994 | Ogle | 216/70 |
| 5,280,154 A | | 1/1994 | Cuomo et al. | 219/121.52 |
| 5,304,279 A | | 4/1994 | Coultas et al. | 156/345 |
| 5,540,824 A | * | 7/1996 | Yin et al. | 204/298.34 |
| 5,558,722 A | * | 9/1996 | Okumura et al. | 118/723 E |
| 5,565,738 A | | 10/1996 | Samukawa et al. | 315/111.51 |
| 5,614,055 A | * | 3/1997 | Fairbairn et al. | 156/345 |
| 5,619,103 A | * | 4/1997 | Tobin et al. | 204/298.08 |
| 5,648,701 A | * | 7/1997 | Hooke et al. | 315/111.31 |
| 5,888,413 A | * | 3/1999 | Okumura et al. | 216/68 |
| 5,907,221 A | | 5/1999 | Sato et al. | 315/111.51 |
| 6,028,285 A | * | 2/2000 | Khater et al. | 219/121.43 |
| 6,080,287 A | * | 6/2000 | Drewery et al. | 204/192.15 |
| 6,149,760 A | * | 11/2000 | Hama | 118/723 I |
| 6,237,526 B1 | * | 5/2001 | Brcka | 118/723 AN |
| 6,245,202 B1 | * | 6/2001 | Edamura et al. | 204/298.06 |
| 6,270,617 B1 | * | 8/2001 | Yin et al. | 156/345 |

FOREIGN PATENT DOCUMENTS

| | | | |
|---|---|---|---|
| EP | 0 756 309 A1 | 1/1997 | |
| EP | 0 838 843 A2 | 4/1998 | |
| JP | 2001-85195 | * 3/2001 | ............ H05H/1/46 |

OTHER PUBLICATIONS

Ventzek et al, "Investigation of electron source and ion flux uniformity in high plasma density inductively coupled etching tools using two–dimensional modeling", J.Vac.Sci.Technol.B 12(6), Nov./Dec. 1994, pp. 3118–3137.*

* cited by examiner

*Primary Examiner*—Jeffrie R. Lund
*Assistant Examiner*—Rudy Zervigon
(74) *Attorney, Agent, or Firm*—Wood, Herron & Evans, L.L.P.

(57) ABSTRACT

A processing system for processing a substrate with a plasma is provided with an antenna for producing a ring-shaped inductively coupled plasma in a vacuum processing chamber particularly useful for coating or etching semiconductor wafer substrates. A three-dimensional antenna in the form of a coil provides spacial distribution of plasma parameters in a ring-shaped region inside of the chamber that can be adapted to specific physical and process requirements. An axially symmetric permanent magnet assembly enhances the ring-shaped concentration of a high-density inductively coupled plasma by trapping the plasma in the ring-shaped region near the inside of a dielectric window located in the chamber wall in close proximity to segments of the antenna that lie adjacent the outside of the window.

39 Claims, 8 Drawing Sheets

RING-SHAPED HIGH-DENSITY PLASMA SOURCE AND METHOD

This invention relates to the generation of high-density plasma, particularly inductively coupled plasma (ICP), useful in processes such as semiconductor wafer processing.

BACKGROUND OF THE INVENTION

Gas plasma generation is widely used in a variety of integrated circuit (IC) fabrication processes, including plasma etching, plasma enhanced chemical vapor deposition (PECVD), and plasma sputter deposition applications. Generally, plasmas are produced within a process chamber by introducing a process gas at vacuum pressure into the chamber and then coupling electrical energy into the chamber to create and sustain a plasma in the process gas. The plasma may exist a t various ionization fractions from $10^{-6}$ to a fully ionized plasma.

The plasma generally contains positively charged ions of working gas that are used for etching a surface of a substrate, sputtering material from a target for depositing a layer of the material onto such a substrate and ions of vaporized coating material to control the deposition of the material onto the substrate by ionized physical vapor deposition (iPVD). The plasma typically contains electrons equivalent in number to the positive charges in the plasma so that the plasma is macroscopically quasi-neutral.

Various ways of producing a plasma within a process chamber are used. Opposed electrodes can be oriented within the chamber to capacitively couple energy to the plasma. Microwave energy and electron cyclotron resonance (ECR) devices are also used. Inductive coupling of energy to the plasma is particularly desirable for producing a high-density plasma, particularly plasmas having a high ionization fraction with a relatively low electron energy or plasma potential. Inductively coupled plasmas (ICP) often use a coil or antenna-shaped and positioned with respect to the processing chamber to inductively couple energy into the processing chamber and thus create and sustain a plasma therein.

In some ICP systems, an inductive coil or antenna is positioned proximate the top portion of the chamber to create a plasma within the chamber. The antenna is positioned on one side of a dielectric plate or window at the top of the processing chamber, and electromagnetic energy from the antenna is coupled through the dielectric window and into the plasma. One such design is illustrated in U.S. Pat. No. 5,556,521. In other ICP systems, helical or solenoidal-shaped coils are wound around the outside of a cylindrical dielectric sidewall of the processing chamber to inductively couple energy to the plasma. One suitable dielectric material for a window or chamber sidewall is quartz.

The geometry of an ICP system is a factor in determining both plasma density and uniformity, which, in turn, can affect the processing uniformity over the area of the substrate. It is usually desirable to produce a uniform, high-density plasma over a significantly large area so that large substrate sizes can be accommodated. Ultra large-scale integrated (ULSI) circuits, for example, are presently formed on wafer substrates having diameters of 200 mm and 300 mm.

In an ICP system, plasma is excited by heating or exciting electrons in the plasma region of the processing chamber. The inductive currents which heat the plasma electrons are der iv ed from oscillating magnetic fields which are produced proximate the inside of the dielectric window or sidewall by RF currents within the inductive antenna or coil. The spatial distribution of those magnetic fields is a function of the sum of the individual magnetic fields produced by each portion or segment of the antenna or coil conductor. Therefore, the geometry of the inductive antenna or coil significantly determines the spatial distribution of the plasma, and particularly the spatial distribution and uniformity of the plasma ion density within the process chamber. Some coil configurations achieve a goal of delivering power linearly over a wide power range within a chamber of a given radius, but it is difficult to scale the process chamber to a larger size for handling larger substrates without significantly increasing the dimensions of the antenna or coil. Replacing an ICP antenna with one of a larger footprint calls for expensive modification to the processing system, and larger antennas and their associated plasmas exhibit greater sensitivity to process parameters within the chamber. For example, with a larger antenna, the plasma process becomes more sensitive to substrate-to-target distance, the target material, the pressure within the process chamber, and the height and width configuration of the chamber. Furthermore, large coils call for large dielectric windows, which must be very thick to withstand the pressure differential across the wall of a high vacuum chamber.

Current ICP systems utilizing planar spiral antennas exhibit asymmetry wherein the distribution of the plasma that is not aligned with the central axis of the chamber, which degrades the uniformity of the deposition or etch process over the area of the substrate. Further, planar antennas often exhibit a ring or doughnutshaped plasma for one process and corresponding set of parameters, while creating a centrally peaked plasma for another process and other parameters. Accordingly, the plasma shape and uniformity is not consistent within such ICP systems and will be process dependent. Therefore, the overall IC fabrication process will not be consistent from one plasma process to another plasma process.

Another drawback of planar antenna systems using an S-shaped coil is that the outer portions of the coil marginally affect the plasmas created by the central region of the coil and give an effect on the uniformity and density of the plasma that is different along one axis of the plane of the coil than along another axis in the plane of the coil.

SUMMARY OF THE INVENTION

An objective of the present invention is to overcome drawbacks in the prior art and provide a plasma processing system, particularly an ICP system, in which a dense, uniform plasma is created. Another objective of the present invention is to provide a uniform plasma that is less dependent upon the size and shape of the process chamber than current plasma processing systems. Still another objective of the invention is to provide a plasma that is symmetrical in the processing chamber.

A further objective of the present invention is to provide a uniform, dense plasma over a large area, such as an area sufficient to handle 200 mm and 300 mm wafers, while maintaining a compact and inexpensive design of the inductive coil or antenna. A still further objective of the present invention to provide consistent plasma generation and thereby provide consistent processes that are less dependent upon process parameters such as pressure and chamber geometry or size.

According to principles of the present invention, a high-density, inductively coupled plasma (ICP) producing source is provided for coupling RF energy into a vacuum processing chamber. The source includes a window of a dielectric material in the chamber wall and having a surface in contact with a processing gas within a vacuum processing chamber. An RF antenna in the form of a coil is isolated from the processing gas by the dielectric material and has first coil segments, preferably lying in a plane parallel to the window, extending circumferentially in a ring close to the surface of the window. A permanent magnet assembly is configured and positioned to generate a ring-shaped magnetic tunnel in the processing chamber near the surface of the dielectric material in a ring-shaped area opposite the window from the coil segments.

In preferred embodiments of the invention, the RF coil is a three-dimensional coil having further second coil segments extending farther from the surface of the window than those extending in the ring. The further segments preferably lie in planes that intersect the dielectric material. Preferably, the half turn segments close to the window include two pairs of segments. The turns of each pair extend around the ring so that current flows in opposite directions, one clockwise and one counterclockwise.

The preferred coil is formed of segments of a single hollow conductor having a cooling fluid passage therein, with the segments connected in series across an RF power generator. The order of the segments preferably is: a clockwise extending first segment, then a second segment, then a clockwise extending first segment, then at least one segment, then a counterclockwise extending first segment, then a second segment, then a counterclockwise extending first segment.

In certain embodiments, at least three of the second coil segments are provided, with the segments arranged as: a clockwise extending first segment, then a second segment, then a clockwise extending first segment, then at least one second segment, then a counterclockwise extending first segment, then a second segment, then a counterclockwise extending first segment. In some such embodiments, the coil includes only seven segments, including the three curved second segments and two pairs of the first segments, arranged with no other intervening segments. In other such embodiments, other segments may be included.

In other embodiments, the coil includes a plurality of the curved second segments, at least two pairs of the first segments and at least one relatively straight intermediate segment lying in t he plane containing the pairs of first segments. Preferably, the segments are arranged as: a clockwise extending first segment, then a second segment, then a clockwise extending first segment, then an intermediate segment, then a counterclockwise extending first segment, then a second segment, then a counterclockwise extending first segment. In some such embodiments, the coil includes only seven segments, including the two curved second segments, two pairs of the first segments and one relatively straight intermediate segment lying in the plane containing the pairs of first segments and oriented such that magnetic field lines encircling the intermediate segment in a plane perpendicular thereto circulate in a direction opposite magnetic field lines encircling the first segments in the same plane, with the segments arranged as: a clockwise extending first segment, then a second segment, then a clockwise extending first segment, then the intermediate segment, then a counterclockwise extending first segment, then a second segment, then a counterclockwise extending first segment. In other such embodiments, other segments may be included.

For example, a coil that has a plurality of the curved second segments, at least two pairs of the first segments and at least one relatively straight intermediate segment lying in the plane containing the pairs of first segments, may include a plurality of at least four curved second segments, at least two pairs of the first segments and at least one relatively straight intermediate segment lying in the plane containing the pairs of first segments and oriented such that magnetic field lines encircling the intermediate segment in a plane perpendicular thereto circulate in a same direction as magnetic field lines encircling the first segments in the same plane, with the segments arranged as: a clockwise extending first segment, then a second segment, then a clockwise extending first segment, then a second segment, then an intermediate segment, then a second segment, then a counterclockwise extending first segment, then a second segment, then a counterclockwise extending first segment. In one such other embodiment, the coil includes four curved second segments, two pairs of the first segments and one such relatively straight intermediate segments.

In various embodiments, the plasma producing source includes a Faraday shield inside the chamber, closely spaced from, and generally parallel to, the dielectric material. The shield has a plurality of slots therethrough immediately opposite the dielectric material from the first segments. The slots include slots that lie in planes generally perpendicular to the first segments, and preferably that lie immediately opposite the dielectric material from the ring and oriented in a generally radial direction. Where intermediate segments are provided, slots are included immediately opposite the dielectric material from the each intermediate that lie in planes generally perpendicular to the intermediate segments.

The permanent magnet assembly preferably includes an inner magnet having a generally circular outer perimeter forming a first pole spaced radially inward of the ring and an annular outer magnet having an inner perimeter forming a second pole, the magnetically opposite of the first pole, spaced radially outward of the ring. The permanent magnet assembly may be located in various positions, one, for example, being adjacent the dielectric material outside of the chamber and another being adjacent, for example, embedded within, the shield.

The source is useful in an etching apparatus in combination with the vacuum chamber having a substrate support within the chamber. Alternatively, the source is further useful in an iPVD apparatus in combination with the vacuum chamber having a substrate support within the chamber that is further equipped with a magnetron sputtering cathode for sputtering material into a region within the chamber containing the high-density inductively coupled plasma.

RF antennae for inductively coupling energy into a vacuum processing chamber for sustaining a high-density plasma formed of the coils described herein are also provided by the invention. Faraday shields for use with RF antenna are also provided by the invention. Such shields include a conductive metal disc having a plurality of slots therethrough in a concentric annular area and oriented in the annular area in a generally radial direction and may include slots therethrough in a central area within the annular area. For deposition applications, particularly those involving coatings of metal, the slots are preferably angled, such as in a chevron shape or Z-shape, so as to prevent line-of-sight paths for particles of coating material moving from the plasma onto the dielectric material.

The plasma source of the invention used in etching coating applications produces a uniformity of plasma in the processing zone, and increased plasma source efficiency.

These and other objectives and advantages of the present invention will be more readily apparent from the following detailed description.

DETAILED DESCRIPTION

The ICP source of the present invention can be used in various plasma processing systems, such as those for performing sputter etching and deposition processes, plasma-enhanced CVD (PECVD) processes, ionized PVD (iPVD) processes, and reactive ion etching processes (RIE). To facilitate understanding of the ICP source and its implementation, it is described in an iPVD apparatus of the type disclosed in U.S. Pat. No. 6,080,287, owned by the assignee of the current application.

Figure 1:
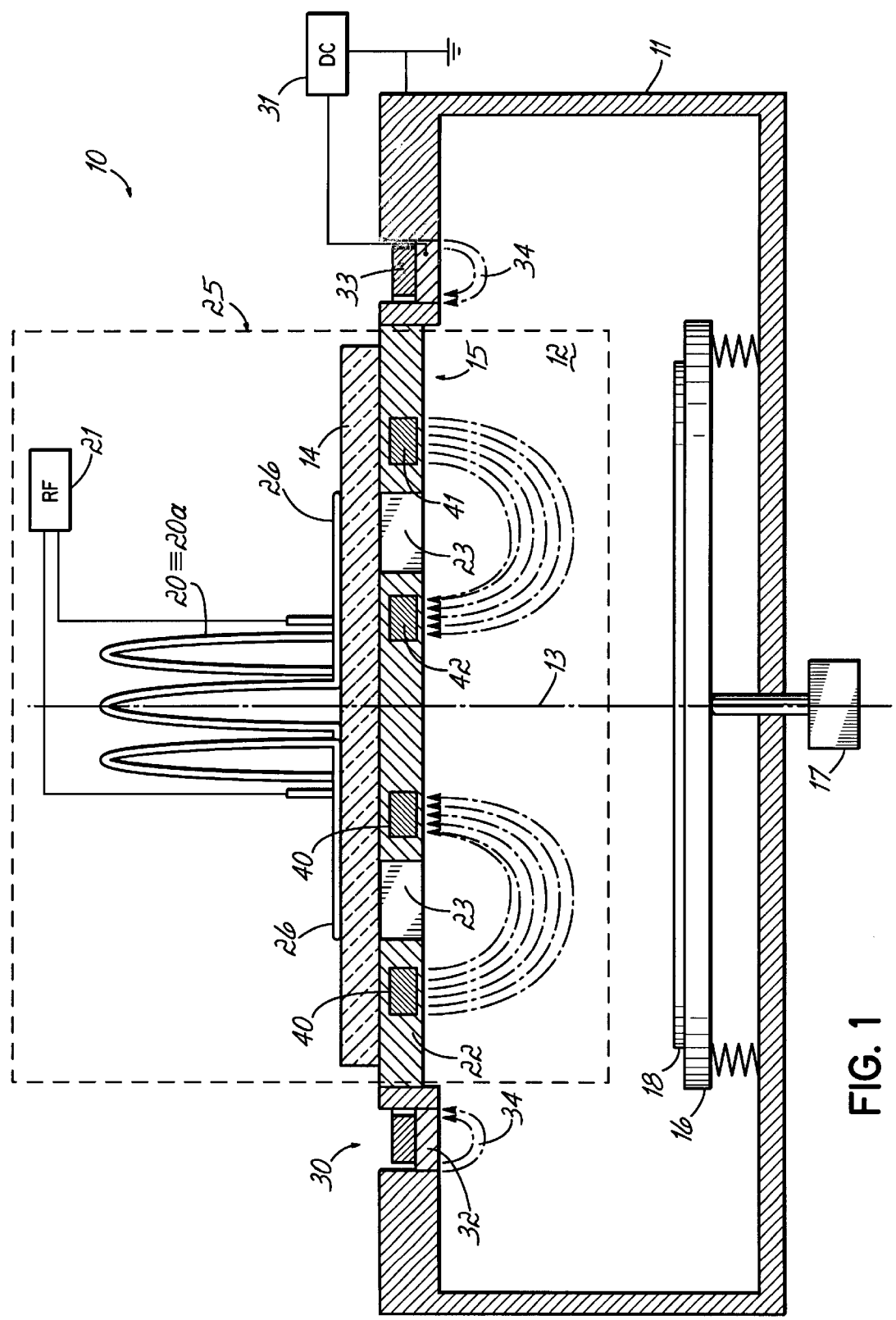
FIG. 1 is a simplified diagram of an ionized physical vapor deposition or alternative etching apparatus embodying principles of the present invention.
Figure 1A:
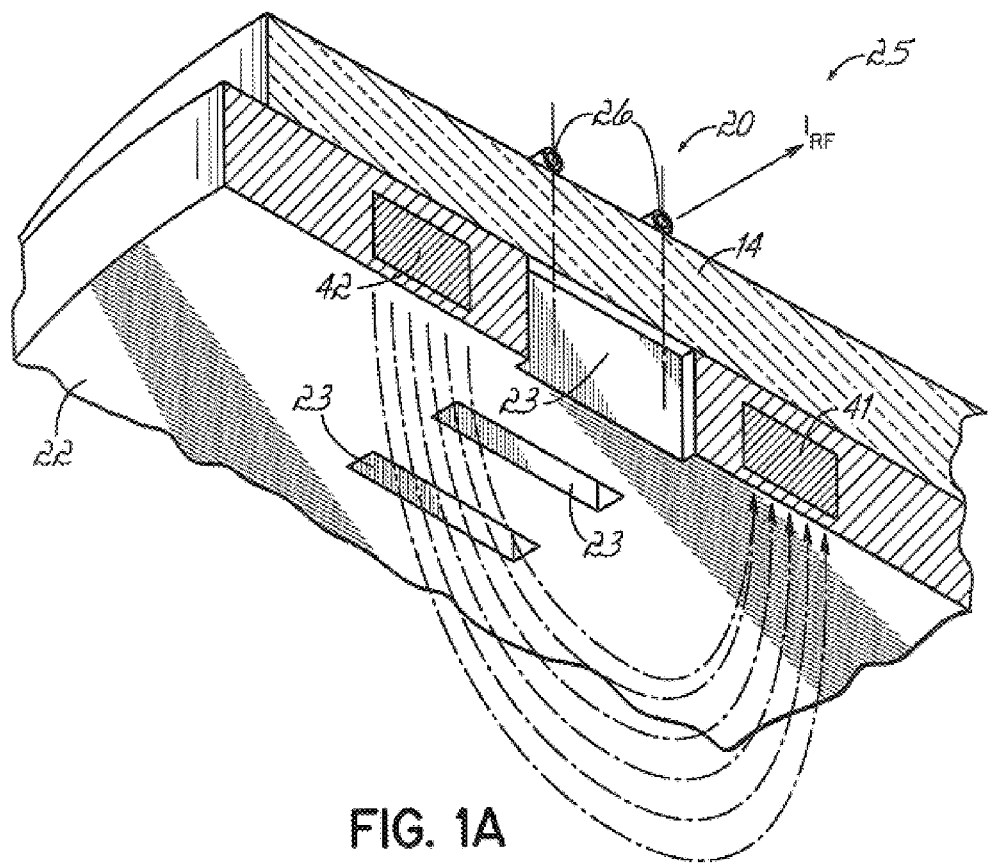
FIG. 1A is an enlarged perspective view of the area designated 1A in FIG. 1.

FIG. 1 is a diagram of an iPVD apparatus 10 of the type described in U.S. Pat. No. 6,080,287, hereby expressly incorporated by reference herein. The apparatus 10 includes a vacuum chamber 12 bounded by a chamber wall 11 having a central vertical axis 13 and a dielectric window 14 centered on the axis 13 and sealed to an opening 15 at the top end of the chamber 12. At the bottom of the chamber 12, centered on the axis 13 and opposite the window 14, is a vertically adjustable substrate support 16, which may have a bias circuit 17 connected thereto to apply a controlled DC or RF potential to a substrate 18, such as a semiconductor wafer, supported on the substrate holder 15 for processing.

On the top of the chamber 12 outside of the window 14, is a threedimensional coil or antenna 20 connected through a matching network (not shown) to an RF energy source 21. Preferably, but optionally, on the inside of the window 15, parallel thereto, is a metal Faraday shield 22 having slots 23 therein. The shield 22 facilitates inductive coupling of RF energy from the coil 20 into the processing gas maintained at a vacuum inside of the chamber 12 while retarding capacitive coupling, which has the desirable effect of keeping the plasma potential low. The coil 20 and the shield 22 in combination with the window 14 may be defined to constitute an ICP source 25.

For deposition, a magnetron sputtering cathode assembly 30 is provided that includes a sputtering target 32 supported in the wall 11 of the chamber 12. The target 30 is preferably annular and surrounds the window 16. A DC power supply 31 connected between the target 32 and the wall 11, which is grounded, applies a negative potential to the target 32, causing the target to discharge electrons into the gas within the chamber 12 to form a sputtering plasma adjacent the surface of the target 30. Behind the target 32 is a permanent magnet assembly 33 which produces magnetic field lines forming a magnetron magnetic tunnel 34 that confines a sputtering plasma over the surface of the target 32.

For etching systems, the magnetron cathode assembly 30 is absent or inoperative. For etching or for the deposition of electrically non-conductive material, the cross section of the slots 23 in the shield 22 may be rectangular or any other cross section, while with the deposition of metal or other electrically conductive coating materials, the slot cross section should be such as to provide no line-of-sight between the plasma and the dielectric window. Details of such a shield and other components of an iPVD apparatus are set forth in U.S. patent application Ser. No. 09/442,600 hereby expressly incorporated by reference herein.

The coil 20 is configured, as more fully explained below, to produce a generally ring-shaped high-density inductively coupled plasma within the chamber 12. To enhance confinement of the ring-shaped plasma, permanent magnets 40 are provided in a plane parallel to the window 14 in the form of concentric rings 41, 42 centered on the chamber axis 13, radially inside and outside, respectively, of segments 26 of the coil 20 that are proximate the window. The magnet rings 40 concentrate the IC plasma in a region below the antenna conductors 26 facing the plasma. In certain embodiments, the coil 20 may couple energy only inductively into the plasma within the chamber 12. In other embodiments, by appropriate selection of design parameters, in lieu of, or in addition to, inductive coupling, RF power may be coupled to the plasma by electron plasma wave coupling and/or other resonant coupling of RF power producing electromagnetic waves inside the plasma.

Figure 2:
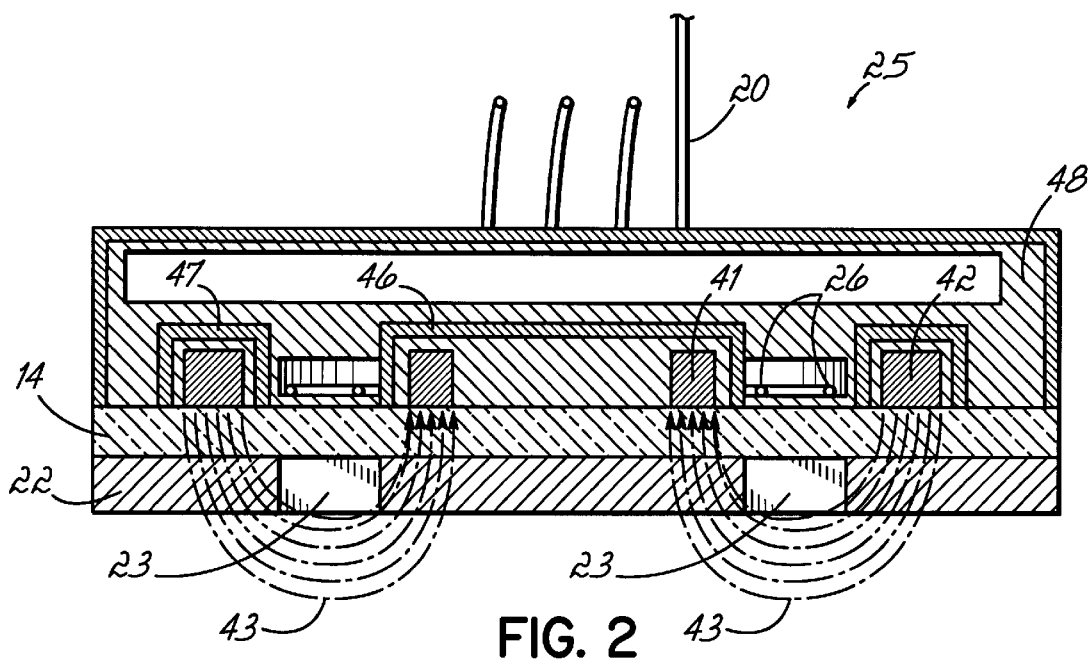
FIG. 2 is a cross-sectional view through one embodiment of an ICP source according to principles of the present invention utilizing external magnets.

FIG. 2 illustrates an embodiment of the ICP source 25 in which the permanent magnet rings 41, 42 are outside of the chamber 12 behind the window 14. The magnet rings 41, 42 of the magnets 40 develop magnetic field lines 43 that arch over a region of the chamber inside of the window 14 adjacent the coil segments 26. The magnet rings 41, 42 are shielded from the electromagnetic fields from the coil 20 by conductive shields 46, 47. An insulator cover or cup 48 is provided which holds the coil 20 in place and fills the space between the coil 20 and the window 14 with a dielectric material such as TEFLON™.

Figure 3:
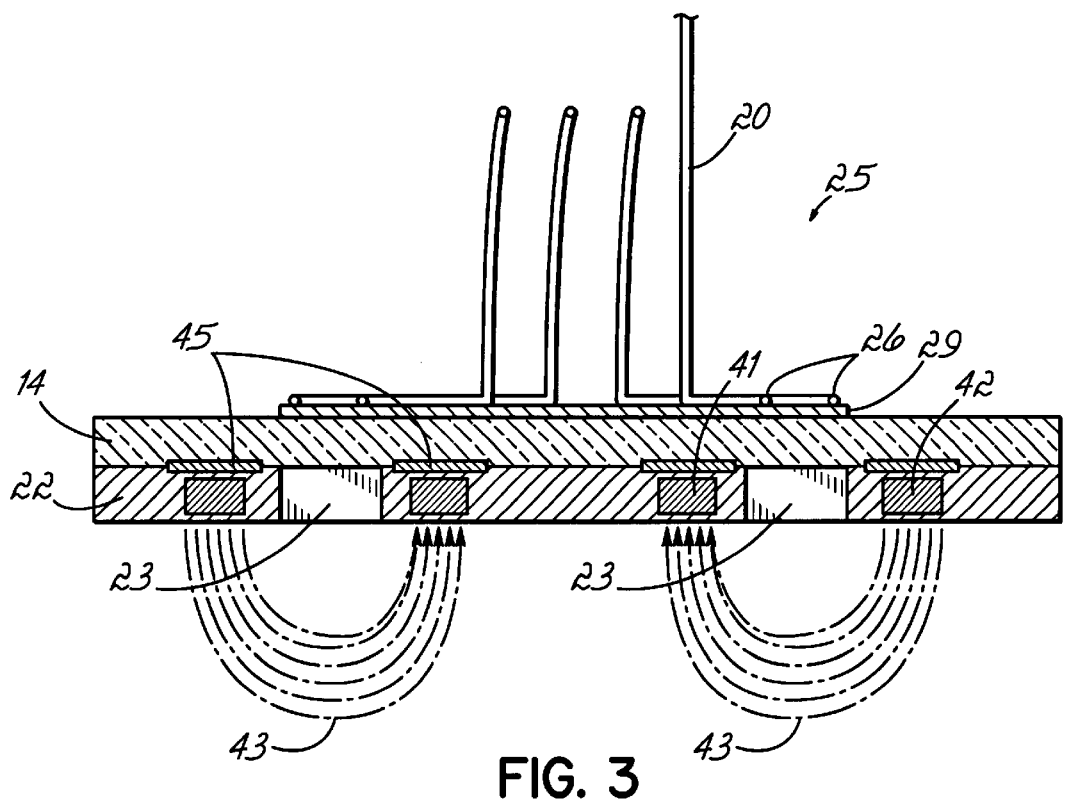
FIG. 3 is a cross-sectional view through an alternative to the ICP source embodiment of FIG. 2 utilizing internal magnets.

FIG. 3 illustrates an alternative embodiment of the ICP source 25 in which the permanent magnet rings 41, 42 are inside of the chamber 12 embedded in the Faraday shield 22. The magnet rings 41, 42 of the magnets 40, so located, similarly develop magnetic field lines 43 that arch over a region of the chamber inside of the window 14 adjacent the coil segments 26. The magnet rings 41, 42 are shielded from the electromagnetic fields from the coil 20 by a metallic shield 45 and by the Faraday shield 22 itself. An insulator cup or disc 29 may be provided to hold the coil 20 in place and fill the space between the coil 20 and the window 14 with dielectric material, preferably TEFLON™.

In both the embodiments of FIGS. 2 and 3, the magnet rings 41 and 42 may be continuous magnetic rings or may be formed of segmented rings or a series of individual magnets, and may form, for example, a toroidal magnetic field inside the plasma within the chamber 12. The inner magnet 41 may also be in the shape of a disc.

Figure 4A:
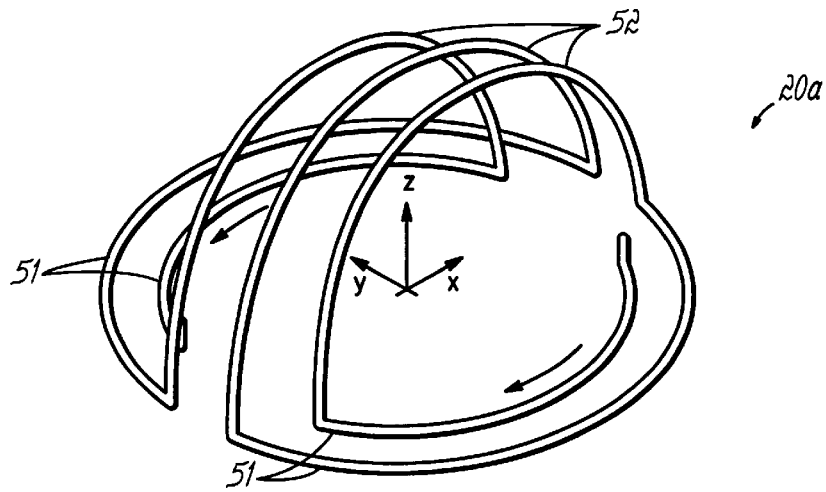
FIGS. 4A–4C are perspective views of three-dimensional coils of various embodiments of the ICP sources of FIGS. 2 and 3.

In FIG. 4A, a three-dimensional coil or antenna 20a is illustrated, with antenna turns, first and second segments 51, 52, respectively, in two plane angles such that approximately half of each complete turn is in one plane and half in the other. The planes are illustrated as perpendicular to each other, but other angles may also be used and more than two plane angles may be used. The distance and angles of the half turns with respect to the dielectric window affect the RF magnetic field penetration through the window and electrostatic Faraday shield 22. Consequently, the distribution inside of the plasma of the power coupled from the coil 20 is also affected. The magnetic field line distribution can accordingly be adjusted to either spread or constrict the size of the plasma.

Figure 4B:
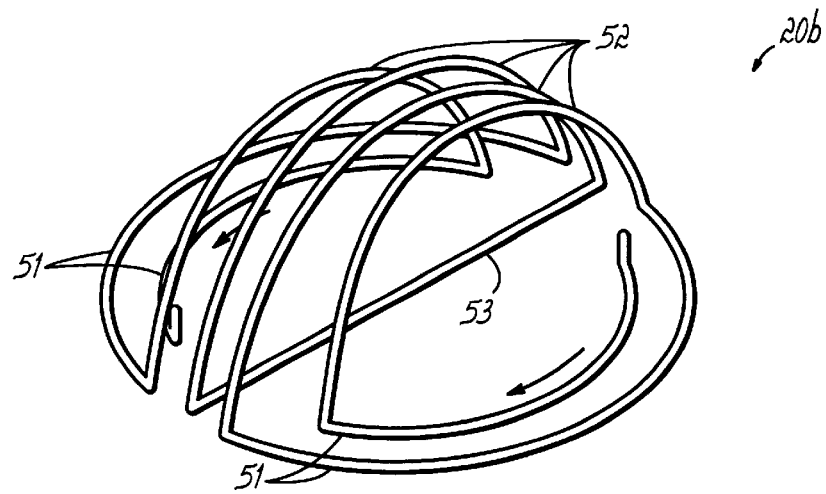
Figure 4C:
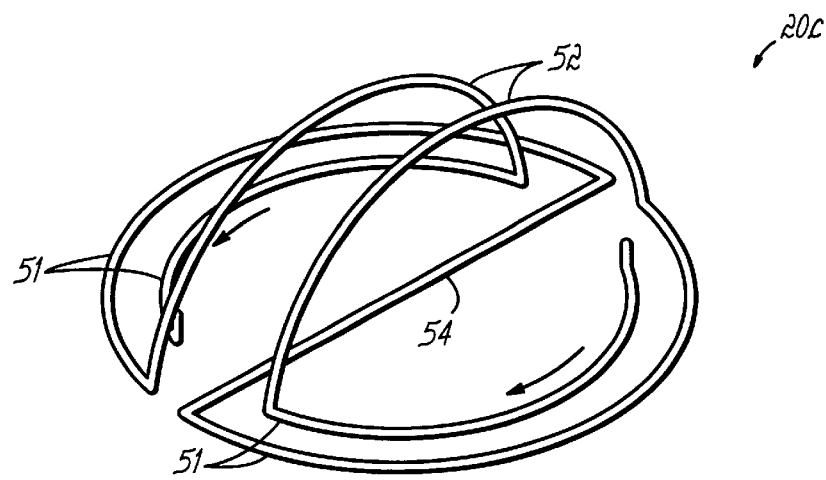

Examples of different coil structures are illustrated with the coils 2b, 2c of FIGS. 4B and 4C. Both of these coils 2b, 2c include the coil first and second segments 51, 52. The segments 51 are those close to the window 14 for providing the most immediate energy for coupling into a ring-shaped space in the chamber 12 for forming the ring-shaped plasma. In addition, the coils 2b, 2c include a central coil segment 53, 54, respectively. The current in the segment 53 is in the same direction as the current in segments 51 where the current in segment 54 is in the opposite direction as the current in segments 51.

Figure 5A:
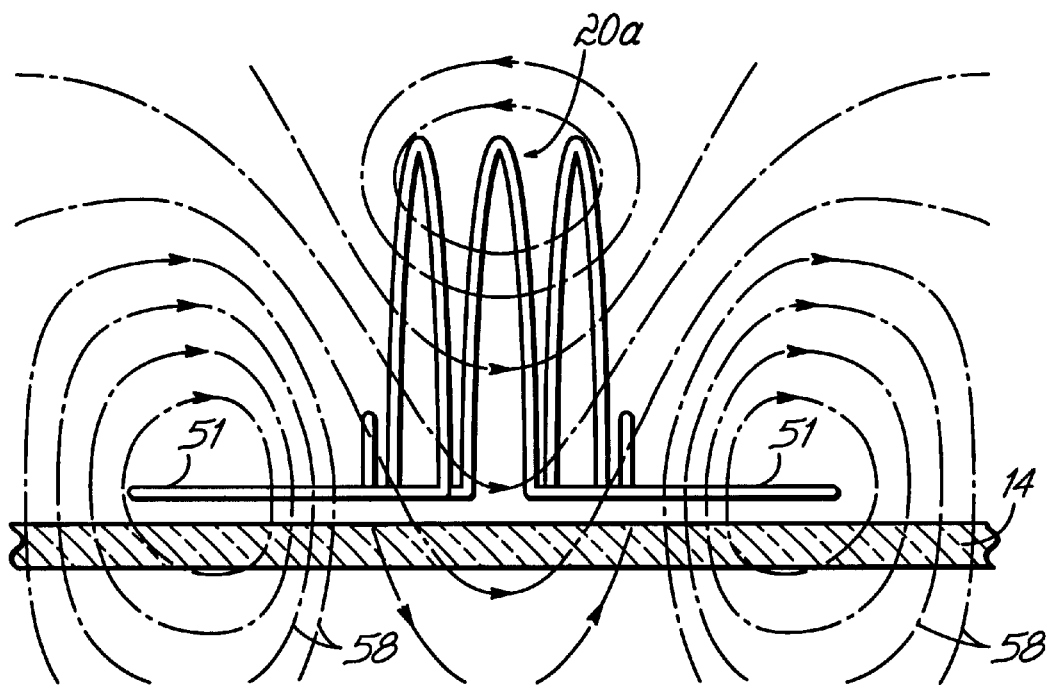
FIGS. 5A–5C are instantaneous magnetic field diagrams of the antennae of the respective FIGS. 4A–4C.
Figure 5B:
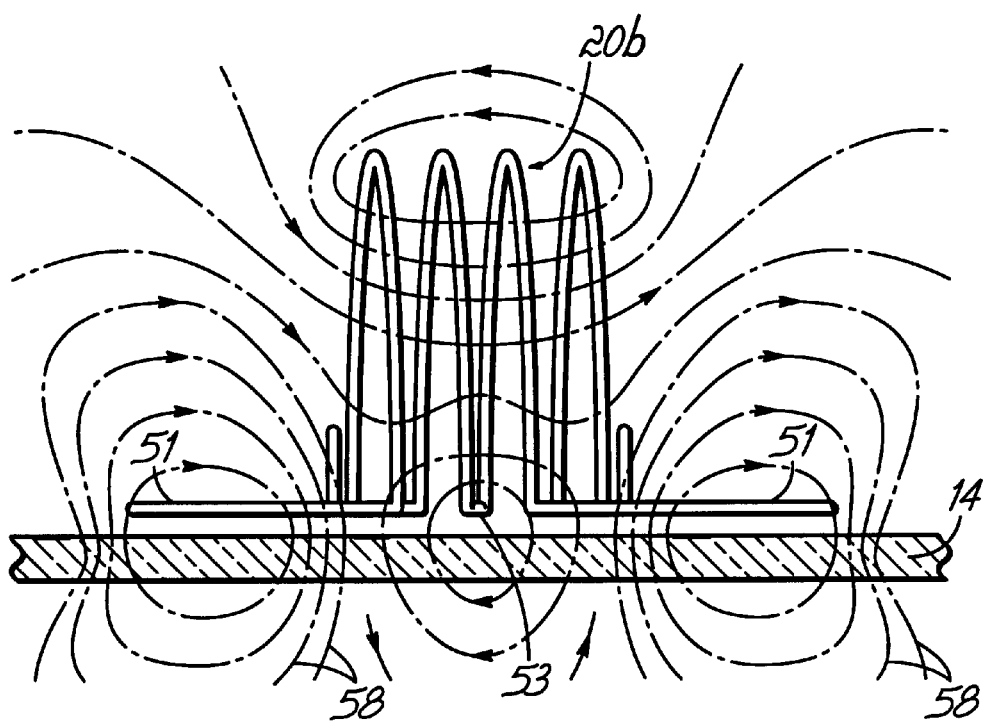
Figure 5C:
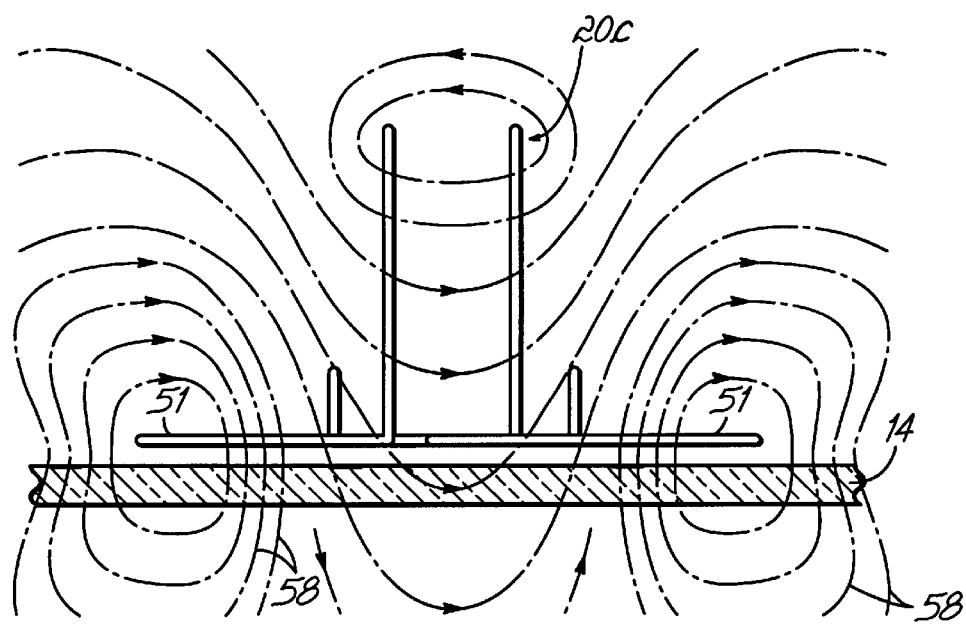
Figures 6A, 6B, 6C:
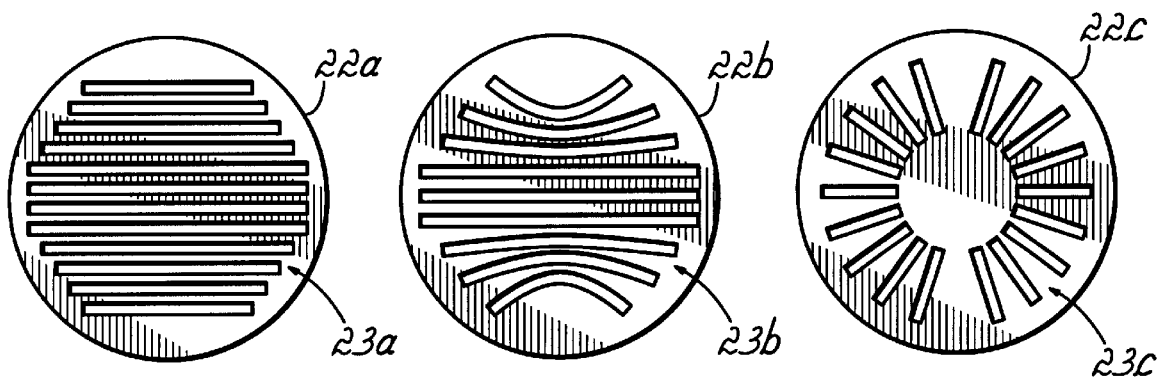
FIGS. 6A–6E are plan views of five alternative Faraday shield slot patterns for use with the respective coils of FIGS. 4A–4C.
Figures 6D, 6E:
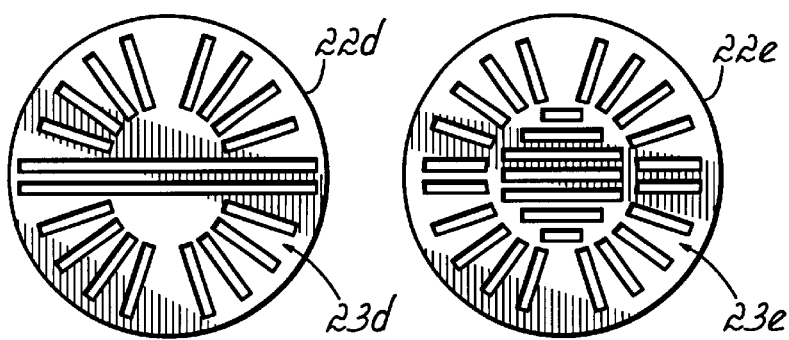

The coils 20a, 20b, 20c produce instantaneous magnetic fields having the shapes illustrated in FIGS. 5A–C, respectively, when the antennae are energized in the absence of the Faraday shield 22 or the permanent magnets 40. All of the antennae or coils 20 produce strong RF magnetic field lines 58 around the conductors 51 that are close to the window 14. These field lines 58 extend into the chamber and energize the ring-shaped plasma. With the Faraday shield 22 designed to effectively inductively couple energy into the plasma, the magnets 40 concentrate and confine the plasma energized in the RF field lines 58 under the field lines 43 from the permanent magnets 40. The field lines 43 produce a magnetic tunnel for the high-density ICP that is distinct from the magnetron cathode magnetic tunnel 34 over the target 32.

The Faraday shield 22 is a conductive metal plate having the slots 23 formed therethrough in patterns that most effectively facilitate inductive coupling of RF energy from the coil 20 into the plasma while, preferably, avoiding capacitive coupling from the coil 30 into the plasma. FIGS. 6A–6E illustrate alternative shields 22a–22e, each having a different pattern of slots 23a–23e. Slots 23 that will achieve such coupling include slots that are generally perpendicular to the conductors 51 that are immediately adjacent the window 14 and generally perpendicular to conductors 53, 54, where present. Slot pattern 23a of the shield 22a is acceptable if used with any of the coils 20a–2c and preferably with the slots 23a oriented perpendicular to the segments 52. Slot pattern 23c of the shield 22c is a recommended pattern for the coil 20a, but not coils 2b or 2c, since they do not permit effective inductive coupling from the central segments 53, 54 into the chamber 12. The other slot patterns 23b, 23d, 23e are recommended patterns for coils 20b, 20c, and are effective also with the coil 20a.

Figure 7C:
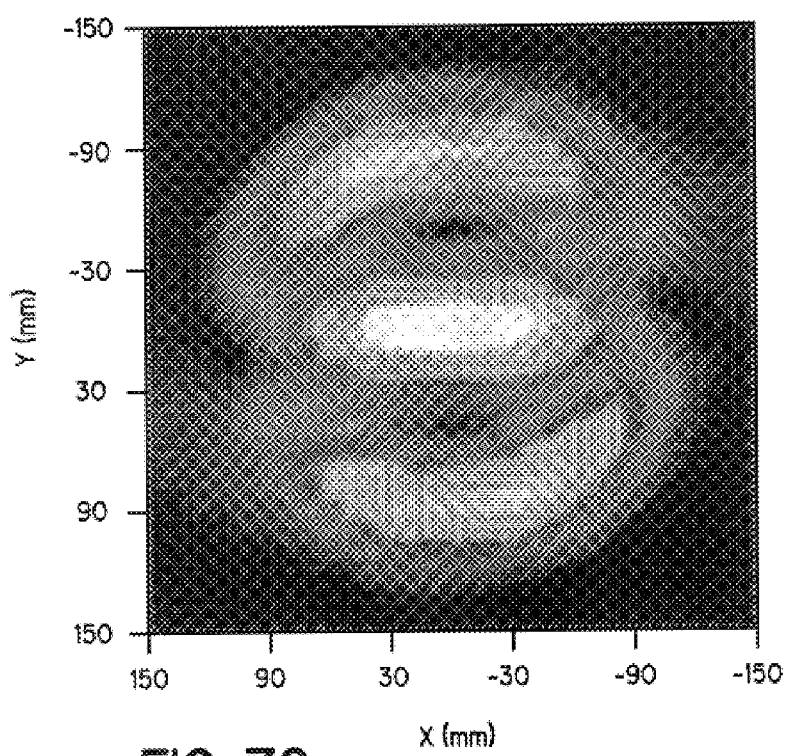
FIGS. 7A–C are plan views of the power density distribution deposited into the plasma for each of the respective coils of FIGS. 4A–4C.
Figure 7A:
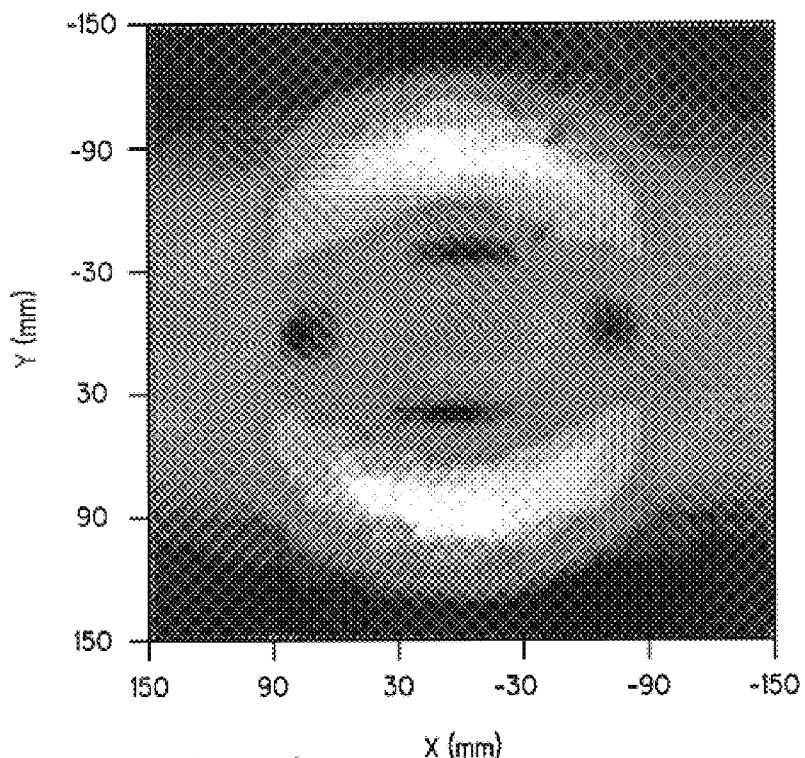
Figure 7B:
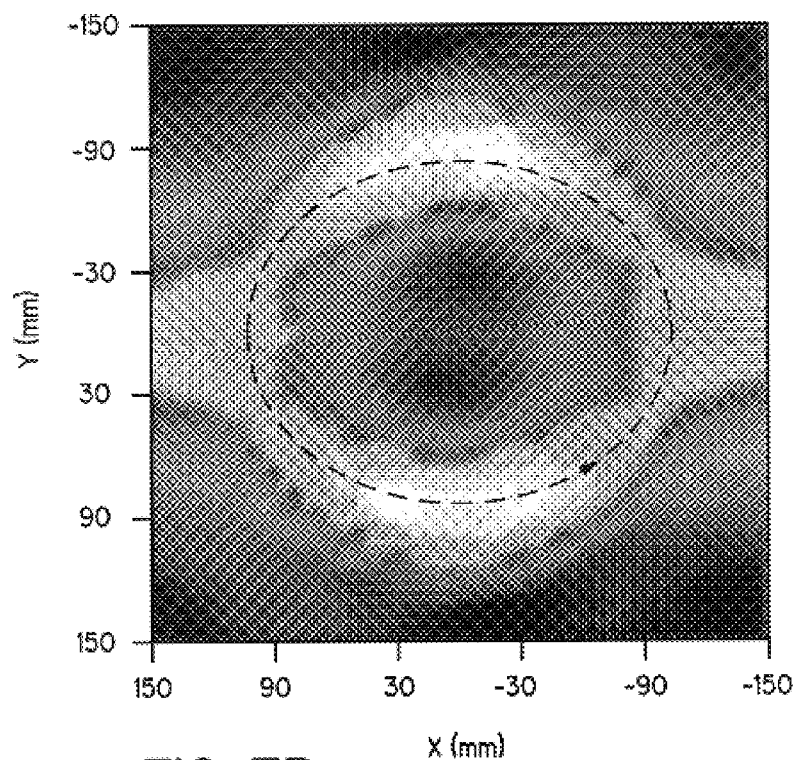
Figure 8:
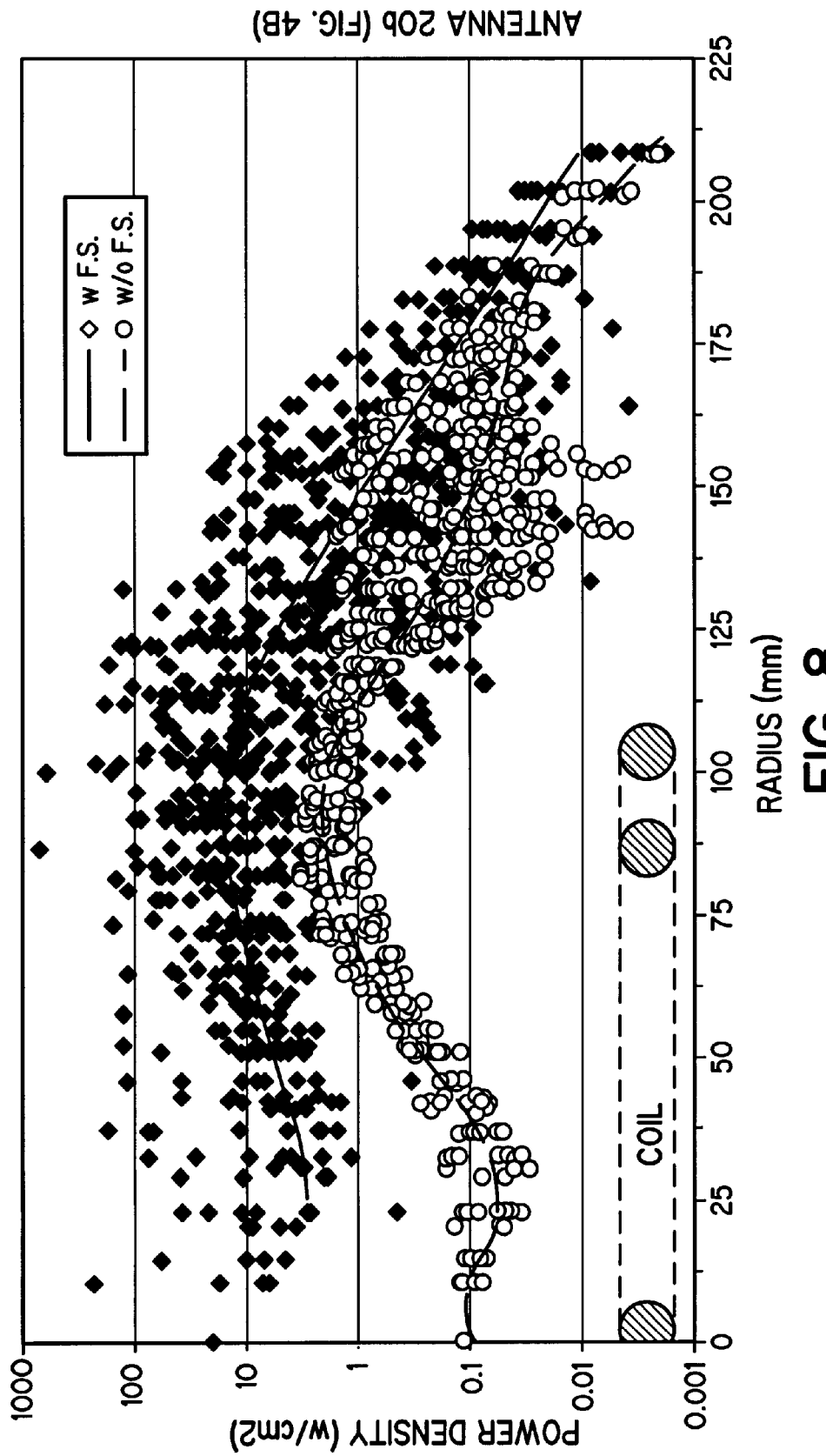
FIG. 8 is a cross-sectional graph of RF power density deposited into the plasma, with and without a Faraday shield, azimuthally averaged from FIG. 7B.

FIGS. 7A–C are two-dimensional graphs representing the power density distribution deposited into the plasma in a plane parallel and close to the window 14 inside of the chamber 12, particularly inside of the Faraday shield 22. In these figures, relatively brighter areas represent relatively greater plasma density. In FIG. 7A, a ring-shaped plasma, as produced by the coil 20a, is illustrated having greater intensity at the top and bottom than at the sides. In FIG. 7B, a ring-shaped plasma, as produced by the coil 20b, is illustrated as having a more distinct ringshaped plasma than the coil 20a as well as a lower density plasma in the center. In FIG. 7C, a ring-shaped plasma, as produced by coil 20c, is less distinct and has a center component due to the reverse direction central coil segment 54. FIG. 8 is a graph of power density deposited into the plasma azimuthally averaged from data from the coil 20b of FIG. 7B, with and without the Faraday shield 22.

While the above description and accompanying drawings set forth various embodiments of the invention, it will be apparent to those skilled in the art that additions and modifications may be made without departing from the principles of the invention.

I claim:

1. A source for producing a high-density, inductively coupled plasma with RF energy in a vacuum processing chamber comprising:

a dielectric material having a surface in contact with a processing gas within a vacuum processing chamber;

an RF coil isolated from the processing gas by the dielectric material and having a plurality of segments including at least first segments thereof collectively forming a generally circularly-shaped ring proximate the dielectric material; and a permanent magnet assembly configured and positioned to generate a ring-shaped magnetic tunnel in the processing chamber adjacent said surface of the dielectric material and opposite from and generally aligned with the circularly-shaped ring formed by said first segments of the coil such that RF energy couples from the first segments of the coil into a volume of the gas enclosed by the ring-shaped magnetic tunnel inside of the chamber.

2. The plasma producing source of claim 1 wherein:

the RF coil is a three-dimensional coil having at least one second segment thereof extending relatively remote from said surface of the dielectric material than the first segments such that some lines of magnetic flux pass between a first and a second segment without passing through the dielectric material.

3. The plasma producing source of claim 1 wherein:

the RF coil is a three-dimensional coil having at least one curved second segment thereof lying in a plane that intersects the dielectric material, the first segments thereof being curved and lying in a plane generally parallel to the dielectric material.

4. The plasma producing source of claim 1 wherein:

the RF coil is a three-dimensional coil having at least one curved second segment of approximately one-half turn lying in a plane that intersects the dielectric material, a plurality of the first segments each being curved and of approximately one-half turn each lying in a plane generally parallel to the dielectric material.

5. The plasma producing source of claim 1 wherein:

the RF coil is a three-dimensional coil including:

at least one curved second segment of approximately one-half turn lying in a plane that intersects the dielectric material, and at least one pair of the first segments are curved and are oriented such that current in the segments of the pair flows around the ring in opposite directions, each approximately one-half turn and lying in a plane generally parallel to the dielectric material.

6. The plasma producing source of claim 1 wherein:
the RF coil is a three-dimensional coil including:
- a plurality of curved second segments, each approximately one-half turn and lying in a plane that intersects the dielectric material, and
- at least two pairs of the first segments, the first segments of each pair:
  - being curved and are oriented such that current in the segments of the pair flows therein around the ring in opposite directions,
  - each approximately one-half turn and lying in a plane generally parallel to the dielectric material.

7. The plasma producing source of claim 1 wherein:
the RF coil is a three-dimensional coil and the plurality of segments includes:
- a plurality of curved second segments, each approximately one-half turn and lying in a plane that intersects the dielectric material, and
- at least two pairs of the first segments, the first segments of each pair:
  - being curved and oriented such that current in the segments of the pair flows therein around the ring in opposite directions, one clockwise and one counterclockwise,
  - each approximately one-half turn and lying in a plane generally parallel to the dielectric material; and
- the segments being formed of a single series conductor and arranged as follows:
  - a clockwise extending first segment, then
  - a second segment, then
  - a clockwise extending first segment, then
  - at least one other segment, then
  - a counterclockwise extending first segment, then
  - a second segment, then
  - a counterclockwise extending first segment.

8. The plasma producing source of claim 1 wherein:
the RF coil is a three-dimensional coil and the plurality of segments includes:
- a plurality of at least three curved second segments, each approximately one-half turn and lying in a plane that intersects the dielectric material, and
- at least two pairs of the first segments, the first segments of each pair:
  - being curved and oriented such that current in the segments of the pair flows therein around the ring in opposite directions, one clockwise and one counterclockwise,
  - each approximately one-half turn and lying in a plane generally parallel to the dielectric material; and
- the segments being formed of a single series conductor and arranged as follows:
  - a clockwise extending first segment, then
  - a second segment, then
  - a clockwise extending first segment, then
  - at least one second segment, then
  - a counterclockwise extending first segment, then
  - a second segment, then
  - a counterclockwise extending first segment.

9. The plasma producing source of claim 1 wherein:
the RF coil is a three-dimensional coil and the plurality of segments includes:
- three curved second segments, each approximately one-half turn and lying in a plane that intersects the dielectric material, and
- two pairs of the first segments, the first segments of each pair:
  - being curved and oriented such that current in the segments of the pair flows therein around the ring in opposite directions, one clockwise and one counterclockwise,
  - each approximately one-half turn and lying in a plane generally parallel to the dielectric material; and
- the segments being formed of a single series conductor and arranged as follows:
  - a clockwise extending first segment, then
  - a second segment, then
  - a clockwise extending first segment, then
  - a second segment, then
  - a counterclockwise extending first segment, then
  - a second segment, then
  - a counterclockwise extending first segment.

10. The plasma producing source of claim 1 wherein:
the RF coil is a three-dimensional coil including:
- a plurality of curved second segments, each approximately one-half turn and lying in a plane that intersects the dielectric material,
- at least two pairs of the first segments, the first segments of each pair:
  - being curved and are oriented such that current in the segments of the pair flows therein around the ring in opposite directions,
  - each approximately one-half turn and lying in a plane generally parallel to the dielectric material; and
at least one relatively straight intermediate segment lying in the plane containing the pairs of first segments.

11. The plasma producing source of claim 1 wherein:
the RF coil is a three-dimensional coil and the plurality of segments includes:
- a plurality of curved second segments, each approximately one-half turn and lying in a plane that intersects the dielectric material,
- at least two pairs of the first segments, the first segments of each pair:
  - being curved and oriented such that current in the segments of the pair flows therein around the ring in opposite directions,
  - each approximately one-half turn and lying in a plane generally parallel to the dielectric material;
at least one relatively straight intermediate segment lying in the plane containing the pairs of first segments; and
the segments being formed of a single series conductor and arranged as follows:
- a clockwise extending first segment, then
- a second segment, then
- a clockwise extending first segment, then
- an intermediate segment, then
- a counterclockwise extending first segment, then
- a second segment, then
- a counterclockwise extending first segment.

12. The plasma producing source of claim 1 wherein:
the RF coil is a three-dimensional coil and the plurality of segments includes:
- two curved second segments, each approximately one-half turn and lying in a plane that intersects the dielectric material,
- two pairs of the first segments, the first segments of each pair:
  - being curved and oriented such that current in the segments of the pair flows therein around the ring in opposite directions, each approximately one-half turn and lying in a plane generally parallel to the dielectric material;
one relatively straight intermediate segment lying in the plane containing the pairs of first segments and oriented such that magnetic field lines encircling the intermediate segment in a plane perpendicular thereto circulate in a direction opposite magnetic field lines encircling the first segments in the same plane; and
the segments being formed of a single series conductor and arranged as follows:
a clockwise extending first segment, then
a second segment, then
a clockwise extending first segment, then
the intermediate segment, then
a counterclockwise extending first segment, then
a second segment, then
a counterclockwise extending first segment.

13. The plasma producing source of claim 1 wherein:
the RF coil is a three-dimensional coil and the plurality of segments includes:
a plurality of at least four curved second segments, each approximately one-half turn and lying in a plane that intersects the dielectric material,
at least two pairs of the first segments, the first segments of each pair:
being curved and oriented such that current in the segments of the pair flows therein around the ring in opposite directions,
each approximately one-half turn and lying in a plane generally parallel to the dielectric material;
at least one relatively straight intermediate segment lying in the plane containing the pairs of first segments and oriented such that magnetic field lines encircling the intermediate segment in a plane perpendicular thereto circulate in a same direction as magnetic field lines encircling the first segments in the same plane; and
the segments being formed of a single series conductor and arranged as follows:
a clockwise extending first segment, then
a second segment, then
a clockwise extending first segment, then
a second segment, then
an intermediate segment, then
a second segment, then
a counterclockwise extending first segment, then
a second segment, then
a counterclockwise extending first segment.

14. The plasma producing source of claim 1 wherein:
the RF coil is a three-dimensional coil and the plurality of segments includes:
four curved second segments, each approximately one-half turn and lying in a plane that intersects the dielectric material,
two pairs of the first segments, the first segments of each pair:
being curved and oriented such that current in the segments of the pair flows therein around the ring in opposite directions,
each approximately one-half turn and lying in a plane generally parallel to the dielectric material;
one relatively straight intermediate segment lying in the plane containing the pairs of first segments and oriented such that magnetic field lines encircling the intermediate segment in a plane perpendicular thereto circulate in a same direction as magnetic field lines encircling the first segments in the same plane; and
the segments being formed of a single series conductor and arranged as follows:
a clockwise extending first segment, then
a second segment, then
a clockwise extending first segment, then
a second segment, then
the intermediate segment, then
a second segment, then
a counterclockwise extending first segment, then
a second segment, then
a counterclockwise extending first segment.

15. The plasma producing source of claim 1 further comprising:
a Faraday shield inside the chamber, closely spaced from the dielectric material and generally parallel thereto.

16. The plasma producing source of claim 1 further comprising:
a Faraday shield inside the chamber, closely spaced from the dielectric material and generally parallel thereto, the shield having a plurality of slots therethrough that, immediately opposite the dielectric material from the first segments, lie in planes generally perpendicular to the first segments.

17. The plasma producing source of claim 1 wherein:
the RF coil is a three-dimensional coil and the plurality of segments includes:
a three curved second segments, each approximately one-half turn and lying in a plane that intersects the dielectric material, and
two pairs of the first segments, the first segments of each pair;
being curved and oriented such that current in the segments of the pair flows therein around the ring in opposite directions, one clockwise and one counterclockwise,
each approximately one-half turn and lying in a plane generally parallel to the dielectric material;
the segments being formed of a single series conductor and arranged as follows:
a clockwise extending first segment, then
a second segment, then
a clockwise extending first segment, then
a second segment, then
a counterclockwise extending first segment; then
a second segment, then
a counterclockwise extending first segment; and
a Faraday shield inside the chamber, closely spaced from the dielectric material and generally parallel thereto, the shield having a plurality of slots therethrough that, immediately opposite the dielectric material from the ring, are oriented in a generally radial direction.

18. The plasma producing source of claim 1 wherein:
the RF coil is a three-dimensional coil and the plurality of segments includes:
a plurality of curved second segments, each approximately one-half turn and lying in a plane that intersects the dielectric material,
at least two pairs of the first segments, the first segments of each pair:
being curved and oriented such that current in the segments of the pair flows therein around the ring in opposite directions,
each approximately one-half turn and lying in a plane generally parallel to the dielectric material;
at least one relatively straight intermediate segment lying in the plane containing the pairs of first segments;

the segments being formed of a single series conductor
and arranged as follows:
a clockwise extending first segment, then
a second segment, then
a clockwise extending first segment, then
an intermediate segment, then
a counterclockwise extending first segment, then
a second segment, then
a counterclockwise extending first segment; and a Faraday shield inside the chamber, closely spaced from the dielectric material and generally parallel thereto, the shield having a plurality of slots therethrough that, immediately opposite the dielectric material from the ring, are oriented in a generally radial direction and immediately opposite the dielectric material from the each intermediate segment lie in planes generally perpendicular to the intermediate segment.

19. The plasma producing source of claim 18 wherein:
the plurality of curved second segments includes at least four second segments; and
the segments are formed of the single series conductor and arranged as follows:
a clockwise extending first segment, then
a second segment, then
a clockwise extending first segment, then
a second segment, then
an intermediate segment, then
a second segment, then
a counterclockwise extending first segment, then
a second segment, then
a counterclockwise extending first segment; and a Faraday shield inside the chamber, closely spaced from the dielectric material and generally parallel thereto, the shield having a plurality of slots therethrough that, immediately opposite the dielectric material from the ring, are oriented in a generally radial direction and immediately opposite the dielectric material from the each intermediate segment lie in planes generally perpendicular to the intermediate segment.

20. The plasma producing source of claim 1 wherein the permanent magnet assembly includes:
an inner magnet having a generally circular outer perimeter forming a first pole spaced radially inward of the ring, and
an annular outer magnet having an inner perimeter forming a second pole having a polarity that is magnetically opposite the polarity of the first pole, spaced radially outward of the ring.

21. The plasma producing source of claim 1 wherein the permanent magnet assembly is located adjacent the dielectric material outside of the chamber.

22. The plasma producing source of claim 1 further comprising:
a Faraday shield inside the chamber, closely spaced from the dielectric material and generally parallel thereto, the permanent magnet assembly being located adjacent the shield inside of the chamber.

23. An etching apparatus comprising the plasma producing source of claim 1 and further comprising:
the vacuum chamber;
an RF power source connected to the RF coil; and
a substrate support within the chamber.

24. An ionized physical deposition apparatus comprising the plasma producing source of claim 1 and further comprising:

the vacuum chamber;
an RF power source connected to the RF coil;
a substrate support within the chamber; and
a magnetron sputtering cathode for sputtering material into a region within the chamber containing the high-density inductively coupled plasma.

25. An RF antenna for inductively coupling energy into a vacuum processing chamber for sustaining a high-density plasma therein comprising:
a three-dimensional coil having a plurality of segments including:
at least two pairs of half-turn semi-circular first segments arranged in a ring and lying in a first plane, the first segments being interconnected to conduct current in opposite directions, one clockwise and one counterclockwise, around the ring, and
a plurality of curved second segments, each approximately one-half turn and each extending substantially outside of the first plane and lying in a plane that intersects the first plane;
the segments being formed of a single series conductor and arranged as follows:
a clockwise extending first segment, then
a second segment, then
a clockwise extending first segment, then
at least one other segment, then
a counterclockwise extending first segment, then
a second segment, then
a counterclockwise extending first segment.

26. The antenna of claim 25 wherein:
the at least one segment arranged between the clockwise extending first segment and the counterclockwise extending first segment includes at least one second segment.

27. The antenna of claim 25 wherein:
the second segments extend from the first plane a distance approximately half the diameter of the ring.

28. The antenna of claim 25 wherein:
the plurality of curved second segments includes at least three curved second segments; and
the segments formed of the single series conductor are arranged as follows:
a clockwise extending first segment, then
a second segment, then
a clockwise extending first segment, then
at least one second segment, then
a counterclockwise extending first segment, then
a second segment, then
a counterclockwise extending first segment.

29. The antenna of claim 25 wherein:
the plurality of curved second segments consists of three curved second segments;
the at least two pairs of first segments consists of two pairs of the first segments; and
the segments formed of the single series conductor are arranged as follows:
a clockwise extending first segment, then
a second segment, then
a clockwise extending first segment, then
a second segment, then
a counterclockwise extending first segment, then
a second segment, then
a counterclockwise extending first segment.

30. The antenna of claim 25 wherein:
the plurality of segments further includes at least one relatively straight intermediate segment lying in the first plane.

31. The antenna of claim 25 wherein:
the plurality of segments further includes at least one relatively straight intermediate segment lying in the first plane; and
the segments formed of the single series conductor are arranged as follows:
a clockwise extending first segment, then
a second segment, then
a clockwise extending first segment, then
an intermediate segment, then
a counterclockwise extending first segment, then
a second segment, then
a counterclockwise extending first segment.

32. The antenna of claim 25 wherein:
the plurality of segments further includes one relatively straight intermediate segment lying in the first plane; and
the plurality of curved second segments consists of two curved second segments;
the at least two pairs of half-turn semi-circular first segments consists of two pairs of the first segments;
the one relatively straight intermediate segment lies in the first plane and is oriented such that magnetic field lines encircling the intermediate segment in a plane perpendicular thereto circulate in a direction opposite magnetic field lines encircling the first segments in the same plane; and
the segments formed of the single series conductor are arranged as follows:
a clockwise extending first segment, then
a second segment, then
a clockwise extending first segment, then
the intermediate segment, then
a counterclockwise extending first segment, then
a second segment, then
a counterclockwise extending first segment.

33. The antenna of claim 25 wherein:
the plurality of curved second segments consists of at least four curved second segments;
the one relatively straight intermediate segment lies in the first plane and is oriented such that magnetic field lines encircling the intermediate segment in a plane perpendicular thereto circulate in a same direction as magnetic field lines encircling the first segments in the same plane; and
the segments formed of the single series conductor are arranged as follows:
a clockwise extending first segment, then
a second segment, then
a clockwise extending first segment, then
a second segment, then
an intermediate segment, then
a second segment, then
a counterclockwise extending first segment, then
a second segment, then
a counterclockwise extending first segment.

34. The antenna of claim 25 wherein:
the plurality of curved second segments consists of at least four curved second segments;
the at least two pairs of half-turn semi-circular first segments consists of two pairs of the first segments;
the one relatively straight intermediate segment lies in the first plane and is oriented such that magnetic field lines encircling the intermediate segment in a plane perpendicular thereto circulate in a same direction as magnetic field lines encircling the first segments in the same plane; and the segments formed of the single series conductor are arranged as follows:
a clockwise extending first segment, then
a second segment, then
a clockwise extending first segment, then
a second segment, then
the intermediate segment, then
a second segment, then
a counterclockwise extending first segment, then
a second segment, then
a counterclockwise extending first segment.

35. A Faraday shield for use with an RF antenna for inductively coupling energy into a vacuum processing chamber for sustaining a high-density plasma therein comprising:
a conductive metal disc having a perimeter, a central area, and a plurality of slots therethrough circumferentially spaced around a ring in a concentric annular area between the perimeter and the central area of the disc and each slot being oriented in the annular area in a generally radial direction each separately surrounded by conductive metal of the perimeter, the central area and the annular area.

36. A Faraday shield for use with an RF antenna for inductively coupling energy into a vacuum processing chamber for sustaining a high-density plasma therein comprising:
a conductive metal disc having a plurality of slots therethrough circumferentially spaced around a ring in a concentric annular area of the disc and oriented in the annular area in a generally radial direction; and
the shield has a further plurality of slots therethrough in a central area within the annular area.

37. A method of producing a high-density, inductively coupled plasma with RF energy in a vacuum processing chamber comprising:
generating with a permanent magnet assembly a ring-shaped magnetic tunnel in the processing chamber adjacent a surface of a dielectric material that is in contact with a processing gas within a vacuum processing chamber;
coupling RF energy into a processing gas through the dielectric material from an RF coil isolated by the dielectric material from the processing space and having at least first segments thereof collectively forming a generally circularly-shaped ring within the magnetic tunnel proximate the dielectric material; and
energizing a ring shaped plasma in the magnetic tunnel with the coupled RF energy.

38. The method of claim 37 further comprising:
coupling said RF energy through a plurality of slots in a Faraday shield located inside of the chamber, closely spaced from the dielectric material and generally parallel thereto, the shield having a plurality of slots therethrough.

39. The method of claim 37 wherein:
the coil is a three-dimensional coil having a plurality of segments including:
at least two pairs of half-turn semi-circular first segments arranged in a ring and lying in a first plane, the first segments being interconnected to conduct current in opposite directions, one clockwise and one counterclockwise, around the ring, and a plurality of curved second segments, each approximately one-half turn and each lying in a plane that intersects the first plane; and the segments of the coil are formed of a single series conductor and arranged as follows:
  a clockwise extending first segment, then
  a second segment, then
  a clockwise extending first segment, then
  at least one other segment, then
  a counterclockwise extending first segment, then
  a second segment, then
  a counterclockwise extending first segment.

* * * * *

UNITED STATES PATENT AND TRADEMARK OFFICE
CERTIFICATE OF CORRECTION

PATENT NO. : 6,523,493 B1
DATED : February 25, 2003
INVENTOR(S) : Jozef Brcka

It is certified that error appears in the above-identified patent and that said Letters Patent is hereby corrected as shown below:

Column 1,
Line 37, reads "antenna-shaped" and should read -- antenna shaped --.

Column 2,
Lines 27 and 28, reads "chamber, which degrades" and should read -- chamber degrades --.
Line 30, reads "doughnutshaped" and should read -- doughnut-shaped --.
Line 61, reads "invention to provide" and should read -- invention is to provide --.

Column 4,
Line 18, reads "segments" and should read -- segment --.
Line 29, reads "from the each" and should read -- from each --.
Line 36, reads "pole, the magnetically" and should read -- pole, magnetically --.

Column 5,
Line 57, reads "threedimensional" and should read -- three-dimensional --.
Line 59, reads "window 15" and should read -- window 14 --.

Column 6,
Lines 3 and 9, reads "target 30" and should read -- target 32 --.
Line 4, reads "window 16" and should read -- window 14 --.
Lines 52 and 64, reads "TEFLON$^{TM}$" and should read -- TEFLON® --.

Column 7,
Line 19, reads "coils 2b, 2c" and should read -- 20b, 20c --.
Lines 19-20, reads "coils 2b, 2c" and should read -- 20b, 20c --.
Line 24, reads "coils 2b, 2c" and should read -- 20b, 20c --.
Line 49, reads "coil 30" and should read -- coil 20 --.
Line 56, reads "20a-2c" and should read -- 20a-20c --.
Line 59, reads "coils 2b or 2c" and should read -- coils 20b or 20c --.

Column 8,
Line 6, reads "ringshaped" and should read -- ring-shaped --.
Line 65, reads "at least one pair of the segments are curved and are oriented" and should read -- at least one pair of the segments is curved and is oriented --.

UNITED STATES PATENT AND TRADEMARK OFFICE
CERTIFICATE OF CORRECTION

PATENT NO. : 6,523,493 B1
DATED : February 25, 2003
INVENTOR(S) : Jozef Brcka

It is certified that error appears in the above-identified patent and that said Letters Patent is hereby corrected as shown below:

Column 9,
Line 9, beginning with "being curved"; subparagraph should be double indented. and
Line 12, beginning with "each approximately" subparagraph should be double indented.
Line 29, beginning with "the segments" subparagraph should not be double indented.

Column 12,
Line 27, reads "a three" and should read -- three --.

Column 13,
Lines 14-16 and 37-39, should read -- radial direction, and immediately opposite the dielectric material from each intermediate segment, lie in --.

Signed and Sealed this

Sixteenth Day of December, 2003

JAMES E. ROGAN
*Director of the United States Patent and Trademark Office*